US010026667B2

(12) United States Patent
Nonogawa

(10) Patent No.: US 10,026,667 B2
(45) Date of Patent: Jul. 17, 2018

(54) METHOD OF MANUFACTURING LIGHT-EMITTING DEVICE

(71) Applicant: TOYODA GOSEI CO., LTD., Kiyosu-shi (JP)

(72) Inventor: Takashi Nonogawa, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 15/622,362

(22) Filed: Jun. 14, 2017

(65) Prior Publication Data
US 2018/0033926 A1 Feb. 1, 2018

(30) Foreign Application Priority Data

Jul. 29, 2016 (JP) ................. 2016-150241

(51) Int. Cl.
H01L 21/00 (2006.01)
H01L 23/29 (2006.01)
H01L 23/28 (2006.01)
H01L 33/56 (2010.01)

(52) U.S. Cl.
CPC .......... H01L 23/28 (2013.01); H01L 33/56 (2013.01); H01L 2924/18301 (2013.01); H01L 2933/005 (2013.01)

(58) Field of Classification Search
CPC .................................. H01L 23/28
USPC .......... 257/795, 740; 438/124–127
See application file for complete search history.

(56) References Cited

U.S. PATENT DOCUMENTS

| 2014/0021506 | A1 | 1/2014 | Yamada |
| 2015/0062965 | A1* | 3/2015 | Oh .......... H01L 33/58 362/608 |
| 2016/0194531 | A1* | 7/2016 | Aoki .......... H01L 33/62 257/79 |
| 2016/0276413 | A1* | 9/2016 | Iida .......... H01L 27/301 |

FOREIGN PATENT DOCUMENTS

| JP | 2014-022581 A | 2/2014 |
| JP | 2015-146449 A | 8/2015 |

* cited by examiner

Primary Examiner — Calvin Lee
(74) Attorney, Agent, or Firm — McGinn IP Law Group, PLLC.

(57) ABSTRACT

A method of manufacturing a light-emitting device that includes a circuit board with p- and n-electrodes formed on a surface of a substrate and a light-emitting element connected to the p- and n-electrodes of the circuit board via a conductor member. The method includes forming two protrusions facing each other on both sides of a gap between the p- and n-electrodes of the circuit board, and dispensing a underfill at a position on an opposite side to the light-emitting element with respect to the two protrusions, allowing the dispensed underfill to flow toward the light-emitting element by a capillary action through the gap between the p- and n-electrodes of the circuit board while contacting the protrusions, and filling, by the capillary action, a gap between the circuit board and the light-emitting element with the underfill reaching a bottom of the light-emitting element.

20 Claims, 7 Drawing Sheets

METHOD OF MANUFACTURING LIGHT-EMITTING DEVICE

The present application is based on Japanese patent application No. 2016-150241 filed on Jul. 29, 2016, the entire contents of which are incorporated herein by reference.

BACKGROUND OF THE INVENTION

1. Field of the Invention

The invention relates to a method of manufacturing a light-emitting device.

2. Description of the Related Art

In some conventional light-emitting devices required to have particularly high reliability, such as light-emitting devices for headlamps, a sealing resin called underfill is used to fill a gap between a substrate and a light-emitting element mounted face-down (see e.g. JP-A-2014-22581).

The underfill covers electrodes of the light-emitting element and prevents the electrodes from being damaged by contact with the air (prevents corrosion damage, etc.). The underfill, when containing white filler, etc., also serves as a reflector and improves light extraction efficiency from the light-emitting element.

Generally, the underfill is dispensed in the vicinity of the light-emitting element and then fills a gap between the light-emitting element and the substrate due to the capillary action. In detail, the dispensed underfill moves toward the light-emitting element due to the capillary action in a gap between p- and n-electrodes connected to the light-emitting element and, once reaching under the light-emitting element, spreads and fills the gap between the light-emitting element and the substrate due to the capillary action.

According to a method of manufacturing a light-emitting device disclosed by JP-A-2014-22581, a underfill-arranging portion is provided in a wide gap between the p- and n-electrodes, and the underfill is dispensed in the underfill-arranging portion. Since the underfill-arranging portion is distant from the light-emitting element, a dispenser used to dispense the underfill does not need to be brought very close to the side surface of the light-emitting element. Therefore, it is possible to prevent a decrease in light extraction efficiency caused by the underfill accidentally covering the side surfaces or adhering to the upper surface of the light-emitting element. In addition, the excess underfill can stay in the underfill-arranging portion. Therefore, even when the dispensed amount of the underfill is excessive, it is unlikely that the underfill covers the side surfaces or adheres to the upper surface of the light-emitting element.

SUMMARY OF THE INVENTION

The method of manufacturing the light-emitting device disclosed by JP-A-2014-22581 may serve to prevent a decrease in light extraction efficiency due to adhesion of the underfill to the light-emitting element at an unintended position. However, a problem may arise that the size of the light-emitting device increases since it is necessary to provide the underfill-arranging portion which is not small relative to the area of the light-emitting element.

It is an object of the invention to provide a method of manufacturing a light-emitting device that enables to accurately fill the underfill without increasing the size of the light-emitting device.

According to an embodiment of the invention, a method of manufacturing a light-emitting device defined by [1] to [5] below is provided.

[1] method of manufacturing a light-emitting device that comprises a circuit board with p- and n-electrodes formed on a surface of a substrate and a light-emitting element connected to the p- and n-electrodes of the circuit board via a conductor member, the method comprising:

forming two protrusions facing each other on both sides of a gap between the p- and n-electrodes of the circuit board; and dispensing a underfill at a position on an opposite side to the light-emitting element with respect to the two protrusions, allowing the dispensed underfill to flow toward the light-emitting element by a capillary action through the gap between the p- and n-electrodes of the circuit board while contacting the protrusions, and filling, by the capillary action, a gap between the circuit board and the light-emitting element with the underfill reaching a bottom of the light-emitting element.

[2] The method according to [1], wherein the two protrusions comprise a dummy bump formed on the p- and n-electrodes.

[3] The method according to [1], wherein the two protrusions comprise a portion of the p- and n-electrodes formed thicker than another portion thereof, or a portion of the substrate formed thicker than another portion thereof.

[4] The method according to any one of [1] to [3], wherein the light-emitting device comprises a Zener diode that is electrically connected to the light-emitting element, and wherein the Zener diode is disposed off an extension line of the gap between the p- and n-electrodes of the circuit board.

[5] The method according to any one of [1] to [4], wherein the light-emitting device further comprises thereon a plate-shaped phosphor-containing member or a phosphor sheet comprising a phosphor.

Effects of the Invention

According to an embodiment of the invention, a method of manufacturing a light-emitting device can be provided that enables to accurately fill the underfill without increasing the size of the light-emitting device.

BRIEF DESCRIPTION OF THE DRAWINGS

Next, the present invention will be explained in more detail in conjunction with appended drawings, wherein:

FIGS. 3A and 3B are enlarged top views showing a light-emitting element and the periphery thereof shown in FIG. 1, wherein FIG. 3A shows the state before filling an underfill and FIG. 3B shows the state after filling the underfill;

FIGS. 4A and 4B are vertical cross-sectional views showing the light-emitting device taken on line B-B of FIG. 3A, wherein FIG. 4A shows the state before filling the underfill and FIG. 4B shows the state after filling the underfill;

FIGS. 5A and 5B are vertical cross-sectional views showing the light-emitting device taken on line C-C of FIG. 3A, wherein FIG. 5A shows the state before filling the underfill and FIG. 5B shows the state after filling the underfill;

FIGS. 6A and 6B show a modified example in which portions of p- and n-electrodes of a circuit board are formed to be thicker than the other portion instead of providing dummy bumps, wherein FIG. 6A is a top view of the modified example and FIG. 6B is a vertical cross-sectional view of the modified example; and FIGS. 7A and 7B show another modified example in which portions of a substrate of the circuit board are formed to be thicker than the other portion instead of providing dummy bumps, wherein FIG. 7A is a top view of the modified example and FIG. 7B is a vertical cross-sectional view of the modified example.

DETAILED DESCRIPTION OF THE PREFERRED EMBODIMENTS

Embodiment

Figure 1:
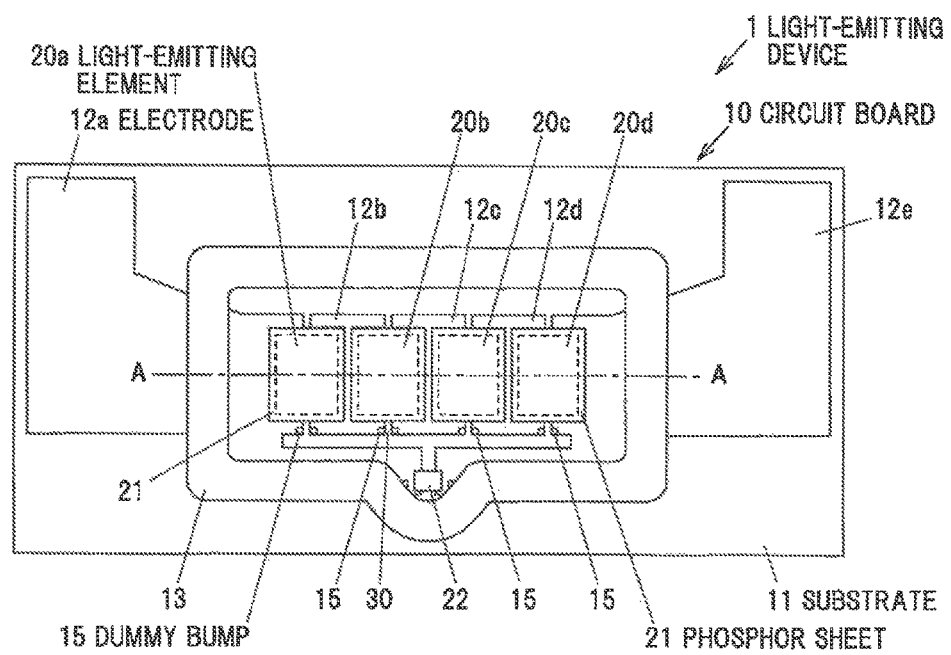
FIG. 1 is a top view showing a light-emitting device in an embodiment.
Figure 2:
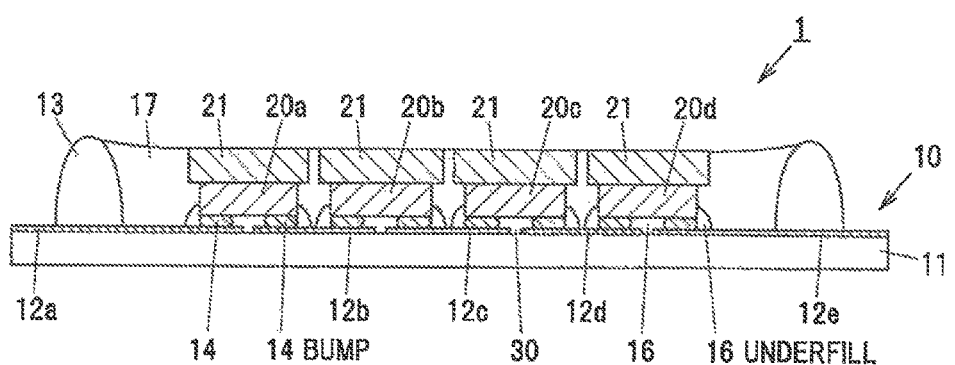
FIG. 2 is a vertical cross-sectional view showing the light-emitting device taken on line A-A of FIG. 1.

FIG. 1 is a top view showing a light-emitting device 1 in an embodiment. FIG. 2 is a vertical cross-sectional view showing the light-emitting device 1 taken on line A-A of FIG. 1. FIG. 1 shows the state before filling an underfill 16 and a sealing resin 17.

The light-emitting device 1 has a circuit board 10 having p- and n-electrodes formed on a surface of a substrate 11, and light-emitting elements 20 (20a, 20b, 20c and 20d) connected to the p- and n-electrodes of the circuit board 10 via a conductor member.

The circuit board 10 has the substrate 11 and electrodes 12 (12a, 12b, 12c, 12d and 12e) formed on the surface of the substrate 11. The electrodes 12a, 12b, 12c, 12d and 12e serve as an n- or p-electrode for supplying an electric current to the light-emitting elements 20a, 20b, 20c and 20d.

The substrate 11 is, e.g., a ceramic substrate such as $Al_2O_3$ substrate or MN substrate, a metal substrate such as Al substrate or Cu substrate with an insulating film covering a surface, or a glass epoxy substrate. The electrodes 12 are formed of a conductive material such as copper.

The electrode pattern of the light-emitting device 1 is not limited to the pattern composed of the electrodes 12a, 12b, 12c, 12d and 12e shown in FIGS. 1 and 2. Also, the number and arrangement of the light-emitting elements are not limited to those of the light-emitting elements 20a, 20b, 20c and 20d shown in FIGS. 1 and 2.

The light-emitting element 20 is, e.g., an LED chip having a chip substrate and a crystal layer which has cladding layers and a light-emitting layer sandwiched therebetween. The light-emitting element 20 is mounted with the crystal layer facing the circuit board 10, i.e., is face-down mounted. The chip substrate is a transparent substrate formed of sapphire, etc., and light is extracted on the chip substrate side.

In the example shown in FIG. 2, the light-emitting element 20c is connected to the electrodes 12c and 12d via bumps 14 (flip-chip mounting). The light-emitting elements 20a, 20b and 20d are connected to the electrodes in the same manner. Alternatively, the light-emitting element 20 may be a light-emitting element other than LED chip and may be, e.g., a laser diode, etc.

The bump 14 is formed of a conductive material such as solder, Au, Ag or Cu. Alternatively, a conductive material in another form, such as conductive paste, may be used instead of the bump 14.

Phosphor sheets 21 are placed on the light-emitting elements 20. The phosphor sheet 21 is formed of a plate-shaped phosphor-containing member such as plate-shaped transparent member of a resin, etc., containing dispersed phosphor particles, or a phosphor such as plate-shaped sintered-phosphor or plate-shaped single crystal phosphor. The fluorescence color of the phosphor contained in or constituting the phosphor sheet 21 is not specifically limited.

The light-emitting elements 20 serves as the light source for excitation of the phosphor contained in or constituting the phosphor sheet 21, and the emission color of the light-emitting device 1 is a mixture of the emission color of the light-emitting element 20 and the emission color of the phosphor sheet 21. When, for, example, the emission color of the light-emitting element 20 is blue and the emission color of the phosphor sheet 21 is yellow, then the emission color of the light-emitting device 1 is white.

The underfill 16 filling a gap between the circuit board 10 and the light-emitting elements 20 covers electrodes of the light-emitting elements 20 and prevents damage thereof caused by contact with the air (corrosion damage, etc.). In addition, the underfill 16 also improves bonding strength between the circuit board 10 and the light-emitting elements 20.

The underfill 16 is formed of, e.g., a resin such as silicone-based resin or epoxy-based resin. The underfill 16, when containing white filler etc., also serves as a reflector and improves light extraction efficiency from the light-emitting elements.

Dummy bumps 15 as a pair of protrusions facing each other are provided on both sides of each gap 30 between the p-electrode and the n-electrode of the circuit board 10, i.e., on both sides of the gap 30 between the electrodes 12a and 12b, the gap 30 between the electrodes 12b and 12c, the gap 30 between the electrodes 12c and 12d and the gap 30 between the electrodes 12d and 12e.

When the dummy bump 15 is formed of the same material as the bump 14, the bumps 14 and the dummy bumps 15 can be continuously formed in the same process.

The light-emitting device 1 may also have an annular dam 13 which surrounds a region for mounting the light-emitting elements 20a, 20b, 20c and 20d, as shown in FIGS. 1 and 2. The dam 13 is formed of, e.g., a resin such as silicone-based resin or epoxy-based resin, and may contain white pigment such as titanium oxide.

A region inside the dam 13 is filled with a sealing resin 17 which seals the light-emitting elements 20a, 20b, 20c and 20d. The sealing resin 17 is formed of, e.g., a transparent resin such as silicone-based resin or epoxy-based resin. The sealing resin 17 may additionally contain a phosphor.

Figure 3A:
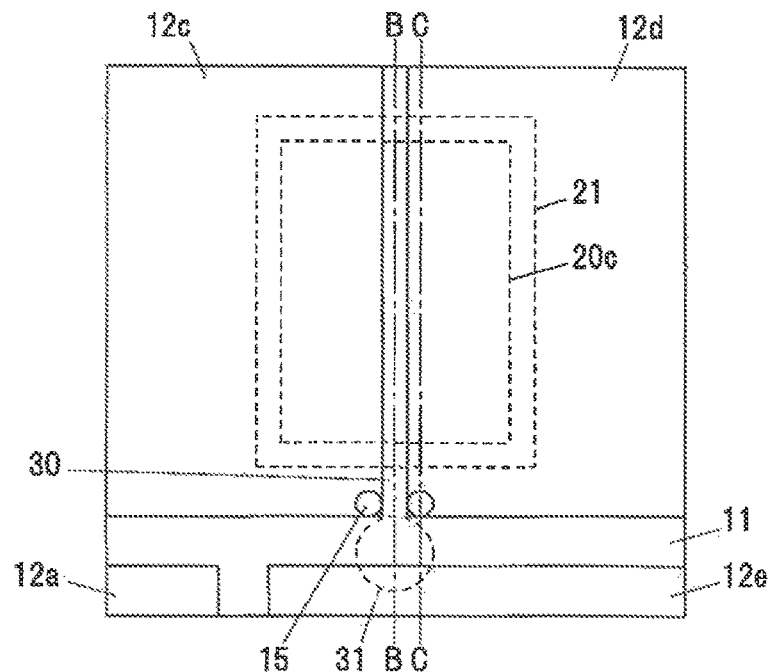
Figure 3B:
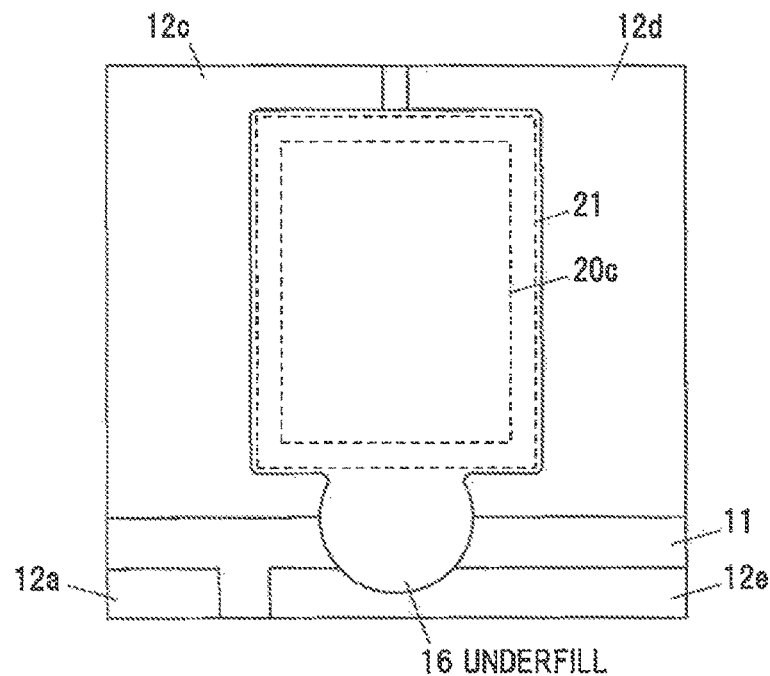

FIGS. 3A and 3B are enlarged top views showing the light-emitting element 20c and the periphery thereof shown in FIG. 1, wherein FIG. 3A shows the state before filling the underfill 16 and FIG. 3B shows the state after filling the underfill 16. In FIGS. 3A and 3B, the light-emitting element 20c and the phosphor sheet 21 thereon are indicated by dotted lines.

Figure 4A:
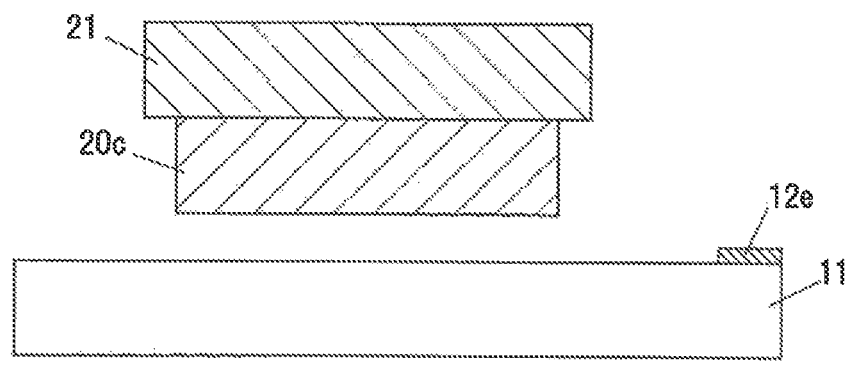
Figure 4B:
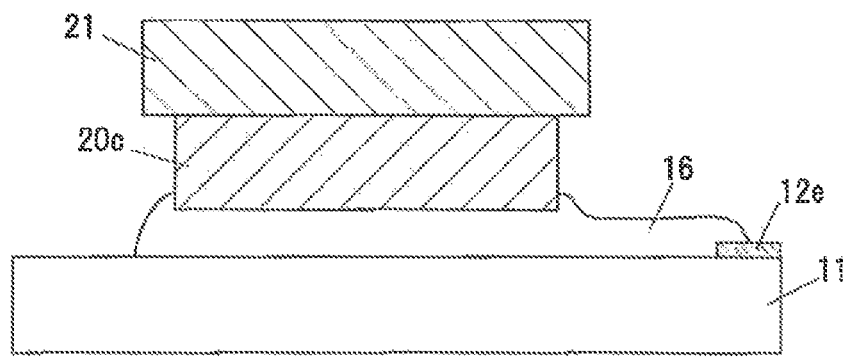

FIGS. 4A and 4B are vertical cross-sectional views showing the light-emitting device 1 taken on line B-B of FIG. 3A, wherein FIG. 4A shows the state before filling the underfill 16 and FIG. 4B shows the state after filling the underfill 16.

Figure 5A:
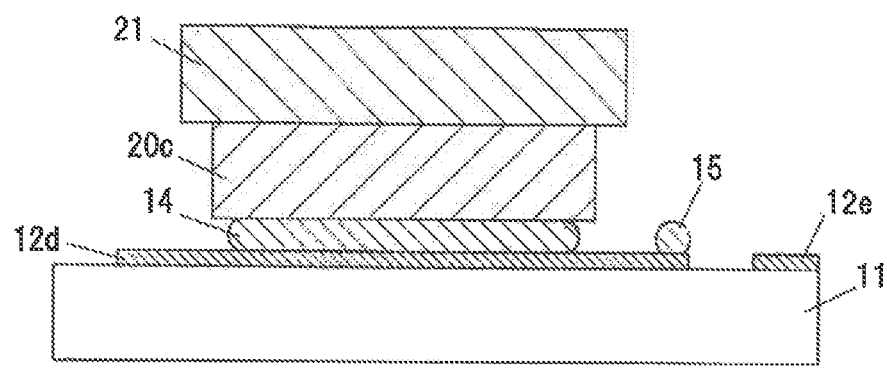
Figure 5B:
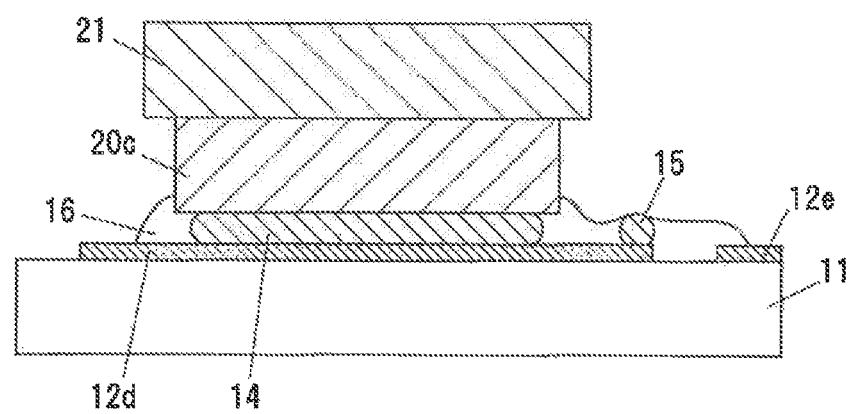

FIGS. 5A and 5B are vertical cross-sectional views showing the light-emitting device 1 taken on line C-C of FIG. 3A, wherein FIG. 5A shows the state before filling the underfill 16 and FIG. 5B shows the state after filling the underfill 16.

The underfill 16 is dispensed on the circuit board 10 by a dispenser, etc. The underfill 16, once in contact with an end portion of the gap 30 between the p- and n-electrodes of the circuit board 10 (i.e., the gap 30 between the electrodes 12a and 12b, the gap 30 between the electrodes 12b and 12c, the gap 30 between the electrodes 12c and 12d and the gap 30 between the electrodes 12d and 12e), flows in the gap 30 toward the light-emitting element 20 due to the capillary action.

A dispensing position for dispensing the underfill 16 is next to the pair of dummy bumps 15 on the side opposite to the light-emitting element 20. A dispensing position 31 for dispensing the underfill 16 to be filled under the light-emitting element 20c is shown in FIG. 3A. The underfill 16 to be filled under the light-emitting elements 20a, 20b and 20d is also dispensed on the respective same positions.

The underfill 16 flows into the gap 30 between the p- and n-electrodes of the circuit board 10 while contacting with the pair of dummy bumps 15, i.e., while being intermediately received the pair of dummy bumps 15, and then flows toward the light-emitting element. Then, the underfill 16, once reaching under the light-emitting element 20, fills a gap between the circuit board 10 and the light-emitting element 20 due to the capillary action.

When the underfill 16 comes into contact with the dummy bumps 15, the underfill 16 is drawn toward the dummy dumps due to wettability thereof, etc., and is guided into the gap 30 between the p- and n-electrodes of the circuit board 10. Therefore, as compared to when the dummy bumps 15 are not provided, the dispensed underfill 16 effectively flows into the gap 30 between the p- and n-electrodes of the circuit board 10. In other words, it is possible to prevent the underfill 16 from climbing on a portion of the phosphor sheet 21 on the dispensing position side or from incompletely spreading in the gap between the circuit board 10 and the light-emitting element 20.

By using the dummy bumps 15, it is possible to accurately fill the underfill 16 in the gap between the circuit board 10 and the light-emitting element 20 without bringing a nozzle of the dispenser too close to the light-emitting element 20. This prevents blocking of light extraction due to the underfill 16 climbing on the phosphor sheet 21 or prevents damage on the phosphor sheet 21 due to contact of the dispenser with the phosphor sheet 21. The same applies even when the mounting positions of the light-emitting elements 20 or the phosphor sheets 21 vary. The dummy bumps 15 exert a great effect particularly when the phosphor sheet 21 is formed of a plate-shaped single crystal phosphor which is likely to be damaged by contact with the dispenser.

The dummy bump 15 is preferably located outside of the phosphor sheet 21 when viewed from the top so that the contact between the nozzle of the dispenser and the phosphor sheet 21 can be prevented more certainly.

Meanwhile, since the dummy bump 15 has a ball-like shape, there is a narrow space in the vicinity of the contact portion of the dummy bump 15 with the circuit board 10, i.e., a gap is present between the dummy bump 15 and the circuit board 10. The underfill 16 is likely to flow into the gap between the dummy bump 15 and the circuit board 10 due to the capillary action and this helps to draw and guide the underfill 16 into the gap 30 between the p- and n-electrodes of the circuit board 10.

The gap 30 between the p- and n-electrodes through which the underfill 16 flows is preferably linear so that the underfill 16 can effectively reach under the light-emitting element 20.

The light-emitting device 1 may have a Zener diode 22 electrically connected to the light-emitting elements 20 as shown in FIG. 1 to absorb surge voltage. In this case, the mounting position of the Zener diode 22 is preferably off the lines extended from the gaps 30 between the p- and n-electrodes of the circuit board 10 to prevent the Zener diode 22 from being obstructive during dispensing the underfill 16, or to prevent the underfill 16 from being drawn toward the Zener diode 22.

Modified Examples

Alternatively, the light-emitting device 1 may have various types of protrusions formed at the same positions as the dummy bumps 15, instead of having the dummy bumps 15. Modified examples thereof are described below.

Figure 6A:
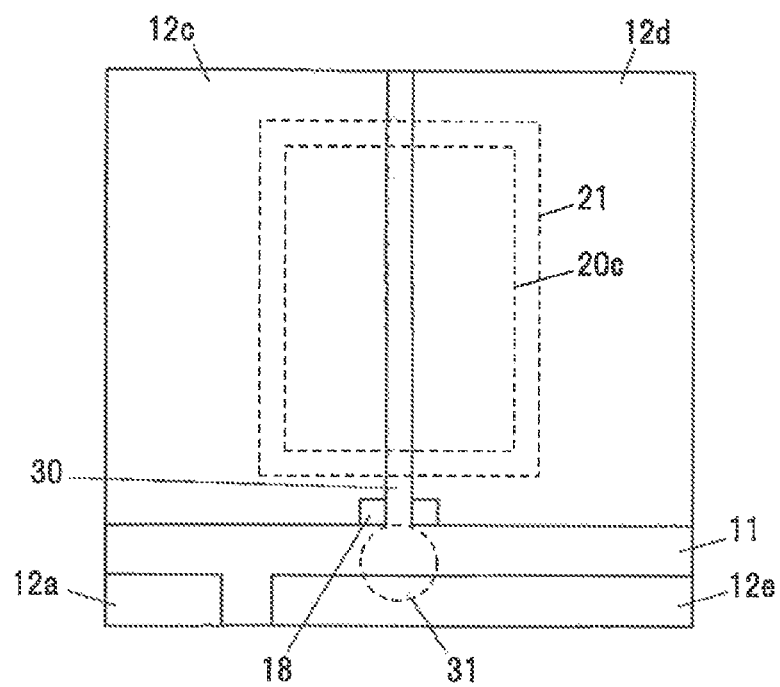
Figure 6B:
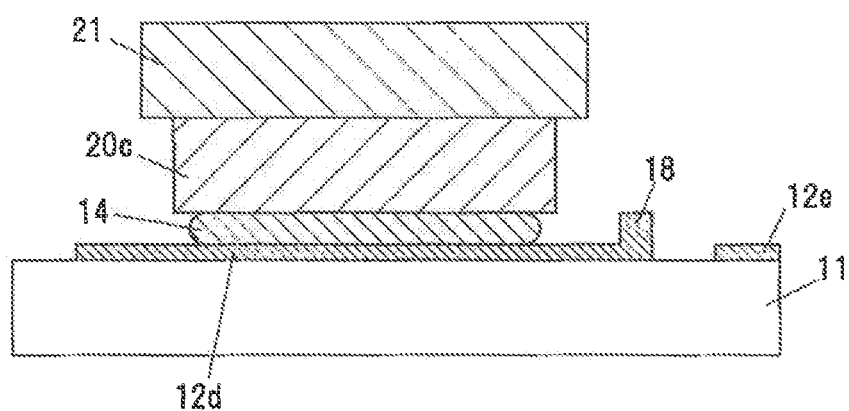

FIGS. 6A and 6B show a modified example in which portions of the p- and n-electrodes (the electrodes 12a, 12b, 12c, 12d and 12e) of the circuit board 10 are formed to be thicker than the other portion instead of providing the dummy bumps 15. FIG. 6A corresponds to the top view of FIG. 3A and FIG. 6B corresponds to the vertical cross-sectional view of FIG. 5A.

Protrusions 18 on the electrodes 12a, 12b, 12c, 12d and 12e are formed at the same positions as the dummy bumps 15 and serve to intermediately receive the underfill 16 in the same manner as the dummy bumps 15.

Figure 7A:
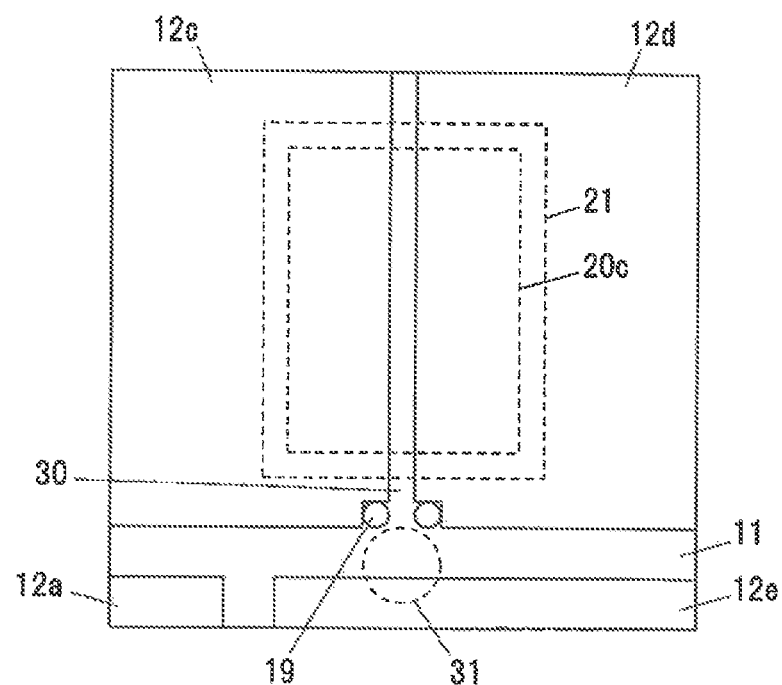
Figure 7B:
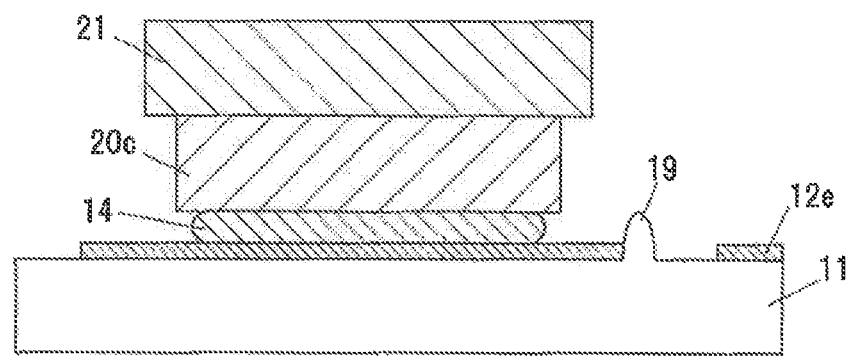

FIGS. 7A and 7B show another modified example in which portions of the substrate 11 of the circuit board 10 are formed to be thicker than the other portion instead of providing the dummy bumps 15. FIG. 7A corresponds to the top view of FIG. 3A and FIG. 7B corresponds to the vertical cross-sectional view of FIG. 5A.

Protrusions 19 on the substrate 11 are formed at the same positions as the dummy bumps 15 and serve to intermediately receive the underfill 16 in the same manner as the dummy bumps 15.

Effects of the Embodiment

In the embodiment, by using the protrusions such as dummy bumps 15, etc., to intermediately receive the underfill 16, it is possible to accurately fill the underfill 16 in the gap between the light-emitting element 20 and the circuit board 10.

In addition, by using the protrusions such as dummy bumps 15, etc., to intermediately receive the underfill 16, it is possible to prevent the nozzle of the dispenser from coming too close to, or coming into contact with, the light-emitting elements 20 or the phosphor sheets 21.

In addition, the dummy bump 15 is small and thus virtually does not affect the size of the light-emitting device 1.

Although the embodiment of the invention has been described, the invention is not intended to be limited to the embodiment and the various kinds of modifications can be implemented without departing from the gist of the invention.

In addition, the invention according to claims is not to be limited to the embodiment. Further, please note that all combinations of the features described in the embodiment are not necessary to solve the problem of the invention.

What is claimed is:

1. A method of manufacturing a light-emitting device, the method comprising:
   disposing a circuit board including p- and n-electrodes on a surface of a substrate;
   connecting a light-emitting element to the p- and n-electrodes of the circuit board via a conductor member;
   forming protrusions on opposing sides of a gap between the p- and n-electrodes of the circuit hoard, in a plan view, the protrusions being located outside the light-emitting element;

dispensing an underfill to flow toward the light-emitting element by a capillary action through the gap between the p- and n-electrodes of the circuit board while contacting the protrusions; and filling, by tire capillary action, a gap between the circuit board and the light-emitting element with the underfill reaching a bottom surface of the light-emitting element, wherein the protrusions are located outside an area extending below the light-emitting element and above the circuit board.

2. The method according to claim 1, further comprising:
disposing a phosphor layer on an upper surface of the light-emitting element.

3. The method according to claim 2, wherein, in the plan view, the protrusions are located outside the phosphor layer.

4. The method according to claim 3, further comprising:
disposing a bump on the bottom surface of the light-emitting element for electrically connecting the light-emitting element to the circuit board.

5. A method of manufacturing a light-emitting device that comprises a circuit board with p- and n-electrodes formed on a surface of a substrate and a light-emitting element connected to the p- and n-electrodes of the circuit board via a conductor member, the method comprising:

forming two protrusions facing each other on both sides of a gap between the p- and n-electrodes of the circuit board; and dispensing an underfill at a position on an opposite side to the light-emitting element with respect to the two protrusions, allowing the dispensed underfill to flow toward the light-emitting element by a capillary action through the gap between the p- and n-electrodes of the circuit board while contacting the protrusions, and filling, by the capillary action, a gap between the circuit board and the light-emitting element with the underfill reaching a bottom of the light-emitting element, wherein the protrusions are located outside an area extending below the light-emitting element and above the circuit board.

6. The method according to claim 5, wherein the forming two protrusions comprises extending an end portion of the p- and n-electrodes above an upper surface of the p- and n-electrodes and away from the substrate such that the end portion of the p- and electrodes has a thickness more than remaining portions of the p- and n-electrodes.

7. The method according to claim 5, wherein the forming two protrusions comprises extending the substrate above an upper surface of the p- and n-electrodes such that a portion of the substrate that protrudes from the gap between the p- and n-electrodes has a thickness more than remaining portions of the substrate.

8. The method according to claim 5, wherein the light-emitting device comprises a Zener diode that is electrically connected to the light-emitting element, and wherein the Zener diode is disposed off an extension line of the gap between the p- and n-electrodes of the circuit board.

9. The method according to claim 5, further comprising:
disposing a bump in the area extending below the light-emitting element and above the circuit board, the bump electrically connecting the light-emitting element to the circuit board.

10. The method according to claim 5, wherein the two protrusions comprise a portion of the p- and n-electrodes formed thicker than another portion thereof, or a portion of the substrate formed thicker than another portion thereof.

11. The method according to claim 5, further comprising:
disposing a bump on the bottom of the light-emitting element for electrically connecting the light-emitting element to the circuit board.

12. The method according to claim 5, further comprising:
disposing an annular dam on the p- and n-electrodes of the circuit board, the annular dam comprising a resin to surround the light-emitting element.

13. The method according to claim 5, wherein the light-emitting device further comprises thereon a plate-shaped phosphor-containing a member or a phosphor sheet comprising a phosphor.

14. The method according to claim 5, wherein the protrusions are located outside an entirety of the area extending below the light-emitting element and above the circuit board.

15. The method according to claim 5, wherein, in a plan view, the protrusions are completely located outside the light-emitting element.

16. The method according to claim 5, wherein, in a plan view, the protrusions are located outside the light-emitting element.

17. The method according to claim 5, wherein the two protrusions comprise a dummy bump formed on the p- and n-electrodes.

18. The method according to claim 5, further comprising:
disposing a phosphor layer on an upper surface of the light-emitting element.

19. The method according to claim 18, further comprising:
disposing a bump on the bottom of the light-emitting element for electrically connecting the light-emitting element to the circuit board.

20. The method according to claim 18, wherein, in a plan view, the protrusions are located outside the phosphor layer.

* * * * *